United States Patent
Venkata et al.

(10) Patent No.: US 8,994,425 B2
(45) Date of Patent: Mar. 31, 2015

(54) TECHNIQUES FOR ALIGNING AND REDUCING SKEW IN SERIAL DATA SIGNALS

(75) Inventors: Ramanand Venkata, Fremont, CA (US); Henry Lui, Millbrae, CA (US); Arch Zaliznyak, San Jose, CA (US)

(73) Assignee: Altera Corporation, San Jose, CA (US)

(*) Notice: Subject to any disclaimer, the term of this patent is extended or adjusted under 35 U.S.C. 154(b) by 41 days.

(21) Appl. No.: 13/566,882

(22) Filed: Aug. 3, 2012

(65) Prior Publication Data
US 2014/0035642 A1 Feb. 6, 2014

(51) Int. Cl.
*H03L 7/00* (2006.01)
*H03K 5/1534* (2006.01)

(52) U.S. Cl.
CPC .................................. *H03K 5/1534* (2013.01)
USPC ........... 327/162; 375/376; 375/375; 375/371; 327/163

(58) Field of Classification Search
USPC .............. 327/141, 144–163; 331/1/A, 15–17; 375/373–376
See application file for complete search history.

(56) References Cited

U.S. PATENT DOCUMENTS

| | | | |
|---|---|---|---|
| 5,313,501 A | 5/1994 | Thacker | |
| 7,162,553 B1 * | 1/2007 | Xue et al. | 710/71 |
| 7,209,531 B1 * | 4/2007 | Katz et al. | 375/371 |
| 7,317,775 B1 | 1/2008 | Erhart et al. | |
| 7,440,532 B1 * | 10/2008 | Chang | 375/372 |
| 7,454,537 B1 * | 11/2008 | Xue | 710/52 |
| 7,551,646 B1 | 6/2009 | Zhang et al. | |
| 7,646,217 B2 | 1/2010 | Venkata et al. | |
| 7,912,169 B2 * | 3/2011 | Saeki et al. | 375/362 |
| 8,005,130 B2 * | 8/2011 | Toyoda et al. | 375/219 |
| 8,050,372 B2 * | 11/2011 | Lee | 375/355 |
| 8,477,897 B1 * | 7/2013 | Chang | 375/372 |
| 8,488,729 B1 | 7/2013 | Mendel et al. | |
| 8,520,787 B2 | 8/2013 | Hennedy | |
| 2008/0285694 A1 * | 11/2008 | Lee | 375/355 |
| 2012/0131249 A1 | 5/2012 | Cepulis et al. | |
| 2013/0243127 A1 * | 9/2013 | Chmelar et al. | 375/316 |

* cited by examiner

*Primary Examiner* — Brandon S Cole
(74) *Attorney, Agent, or Firm* — Steven J. Cahill (57) ABSTRACT

A circuit includes first and second aligner circuits and a deskew circuit. The first aligner circuit is operable to align a first input serial data signal with a control signal to generate a first aligned serial data signal. The second aligner circuit is operable to align a second input serial data signal with the control signal to generate a second aligned serial data signal. The deskew circuit is operable to reduce skew between the first and the second aligned serial data signals to generate first and second output serial data signals.

21 Claims, 9 Drawing Sheets

TECHNIQUES FOR ALIGNING AND REDUCING SKEW IN SERIAL DATA SIGNALS

FIELD OF THE DISCLOSURE

The present invention relates to electronic circuits, and more particularly, to techniques for aligning and reducing skew in serial data signals.

BACKGROUND

A field programmable gate array (FPGA) integrated circuit includes input/output (I/O) regions, regions of programmable logic circuits, and programmable interconnect resources that can be used to interconnect the regions of programmable logic circuits with each other and with the I/O regions. By properly programming or configuring the programmable logic circuits and the programmable interconnect resources, a user can configure an FPGA to perform a desired function. The I/O regions also may be programmable.

The interconnect resources of an FPGA may include global interconnect resources that carry signals to and among many different parts of the integrated circuit, regional interconnect resources that carry signals within a substantial portion, but less than all, of the integrated circuit, and local interconnect resources that carry signals within groupings of programmable logic circuits.

FPGAs have been continually increasing in size and capability. Many FPGAs have a large number of channels in the I/O regions that receive and transmit data signals with external devices. However, as the number of channels on an FPGA has increased, the amount of interconnect resources, including both signal lines and switching or routing resources to create desired signal paths, also has increased. In many current FPGAs, the interconnect resources consume a substantial portion of the die area of the integrated circuit. Thousands of interconnect wires may be used to connect multiple FPGAs to each other and to other integrated circuits on a circuit board.

BRIEF SUMMARY

According to some embodiments described herein, a circuit includes first and second aligner circuits and a deskew circuit. The first aligner circuit is operable to align a first input serial data signal with a control signal to generate a first aligned serial data signal. The second aligner circuit is operable to align a second input serial data signal with the control signal to generate a second aligned serial data signal. The deskew circuit is operable to reduce skew between the first and the second aligned serial data signals to generate first and second output serial data signals.

Various objects, features, and advantages of the present invention will become apparent upon consideration of the following detailed description and the accompanying drawings.

DETAILED DESCRIPTION

Multiple data signals can be transmitted in serial through conductors on an integrated circuit or between integrated circuits. For example, multiple serial data signals can be transmitted across an integrated circuit die. As another example, data signals can be transmitted in serial from one integrated circuit to another integrated circuit through an interposer. Transmitting the data signals in serial rather than in parallel reduces the number of conductors used to transmit the data signals and reduces routing congestion. However, if the conductors used to transmit the data signals in serial have different lengths, the data signals may be skewed relative to each other when the data signals arrive at their destination. According to some embodiments described herein, data signals that have been transmitted in serial are aligned at a receiving circuit based on a common control signal and deskewed relative to each other.

Figure 1:
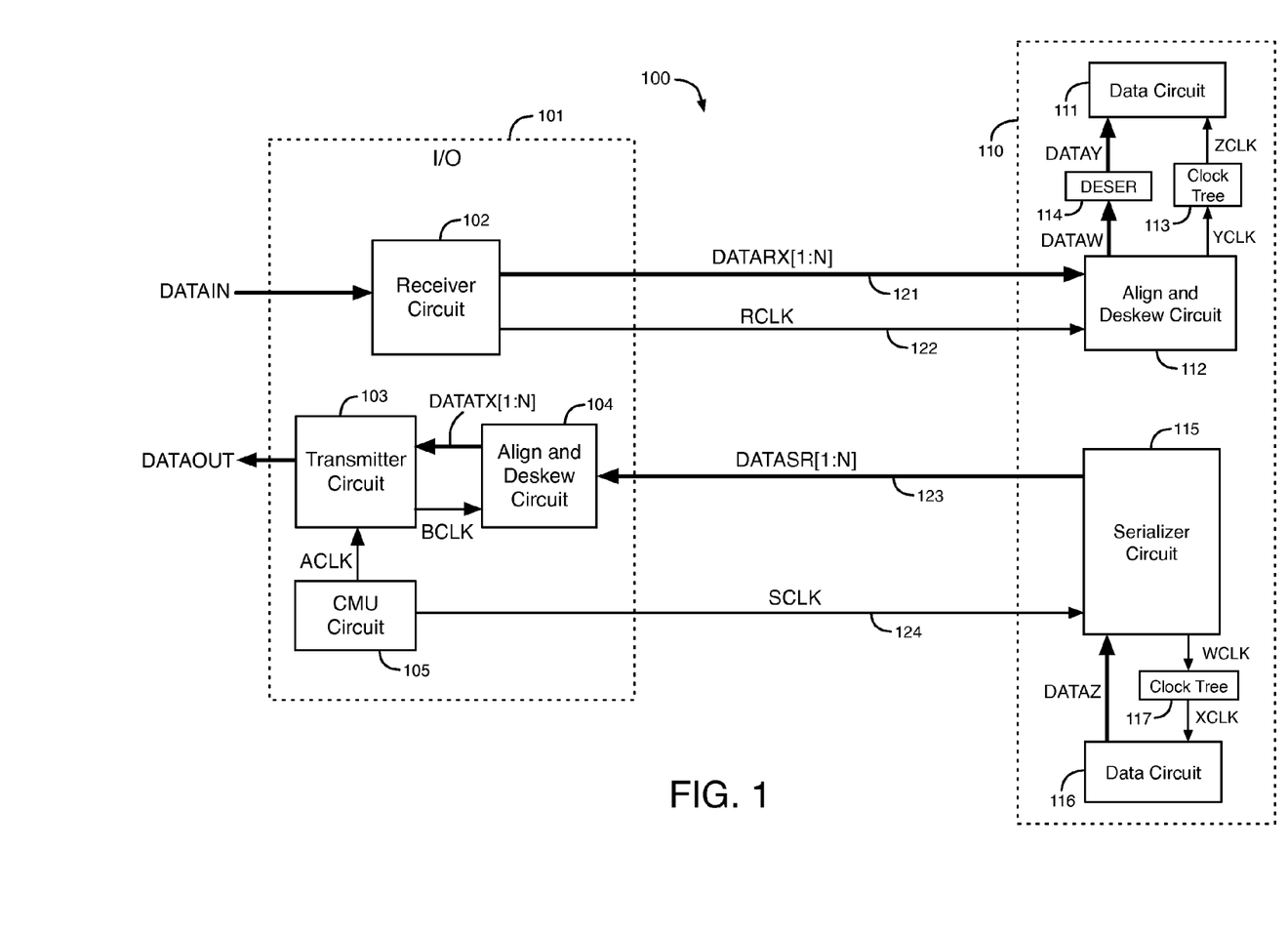
FIG. 1 illustrates an example of a data transmission system, according to an embodiment of the present invention.

FIG. 1 illustrates an example of a data transmission system 100, according to an embodiment of the present invention. Data transmission system 100 includes an input/output (I/O) circuit 101 and a circuit 110. I/O circuit 101 and circuit 110 are connected by conductors 121-124. In one embodiment, I/O circuit 101, circuit 110, and conductors 121-124 are in the same integrated circuit die. In this embodiment, I/O circuit 101 and circuit 110 are in two separate regions of the integrated circuit die. In another embodiment, I/O circuit 101 and circuit 110 are in two separate integrated circuit dies and conductors 121-124 are external routing conductors.

I/O circuit 101 includes a receiver circuit 102, a transmitter circuit 103, an align and deskew circuit 104, and a clock multiplier unit (CMU) circuit 105. As an example, I/O circuit 101 may be a high speed serial interface (HSSI) circuit in an integrated circuit. As another example, I/O circuit 101 may be a memory interface circuit in a memory integrated circuit.

Circuit 110 includes a data circuit 111, an align and deskew circuit 112, a clock tree 113, a deserializer (DESER) circuit 114, a serializer circuit 115, a data circuit 116, and a clock tree 117. As an example, circuit 110 may be in a field programmable gate array integrated circuit, and data circuits 111 and 116 may include programmable logic circuits. As another example, circuit 110 may be in a memory integrated circuit, and data circuits 111 and 116 may be memory circuits.

An N number of input data signals DATAIN are transmitted to inputs of receiver circuit 102 in I/O circuit 101. N may be any integer number greater than 1. Each of the input data signals DATAIN is transmitted in serial to receiver circuit 102. The input data signals DATAIN indicate a set of input data. In an embodiment, receiver circuit 102 includes an N number of clock data recovery circuits. Each of the clock data recovery circuits in receiver circuit 102 receives a different one of the serial input data signals DATAIN. Each of the clock data recovery circuits in receiver circuit 102 generates a recovered clock signal based on the serial input data signal received at that clock data recovery circuit using a clock data recovery technique.

Receiver circuit 102 provides the input data indicated by signals DATAIN to align and deskew circuit 112 as an N number of data signals DATARX[1:N] through an N number of conductors 121. Each of the data signals DATARX[1:N] is transmitted in serial to circuit 112 through one of conductors 121. Receiver circuit 102 provides one of the recovered clock signals to align and deskew circuit 112 as clock signal RCLK through conductor 122. Align and deskew circuit 112 aligns the input data indicated by data signals DATARX[1:N] based on a common control signal and reduces skew between data signals DATARX[1:N] to generate an N number of serial deskewed data signals DATAW. Deserializer circuit 114 converts the serial deskewed data signals DATAW into parallel data signals DATAY.

Data signals DATAY indicate the same input data as data signals DATARX[1:N]. Data signals DATAY are provided to data circuit 111. In an embodiment, the N number of serial data signals DATARX[1:N] is substantially less than the number of parallel data signals DATAY, and therefore, serial data signals DATARX[1:N] use less conductors for transmission than parallel data signals DATAY, reducing routing congestion.

Align and deskew circuit 112 generates a clock signal YCLK based on clock signal RCLK. Clock signal YCLK is provided to data circuit 111 through clock tree 113 as clock signal ZCLK. Data circuit 111 may be any type of circuit that stores or processes data. For example, data circuit 111 may be a memory circuit that stores the data indicated by signals DATAY or processing circuitry that processes the data indicated by signals DATAY.

Data circuit 116 provides a set of data signals DATAZ in parallel to serializer circuit 115 in response to a clock signal XCLK. Data circuit 116 may be any type of circuit that stores or processes data. For example, data circuit 116 may be a memory circuit that stores the data indicated by signals DATAZ or processing circuitry that processes the data indicated by signals DATAZ.

CMU circuit 105 includes a phase-locked loop circuit that generates clock signals SCLK and ACLK. Clocks signals SCLK and ACLK may have the same frequencies or different frequencies. Clock signal SCLK is provided through conductor 124 to serializer circuit 115. Serializer circuit 115 generates a clock signal WCLK using a frequency divider circuit that divides the frequency of clock signal SCLK to generate the frequency of WCLK. Clock signal WCLK is provided to data circuit 116 through clock tree 117 as clock signal XCLK.

Serializer circuit 115 converts the parallel data signals DATAZ into an N number of serial data signals DATASR[1:N] in response to clock signal SCLK. Data signals DATASR[1:N] are provided in serial to align and deskew circuit 104 through an N number of conductors 123. In an embodiment, the N number of serial data signals DATASR[1:N] is substantially less than the number of parallel data signals DATAZ, and therefore, data signals DATASR[1:N] use less conductors for transmission than data signals DATAZ.

Align and deskew circuit 104 aligns the data indicated by data signals DATASR[1:N] based on a common control signal and reduces skew between data signals DATASR[1:N] to generate an N number of deskewed serial data signals DATATX[1:N]. Data signals DATATX[1:N] indicate the same data as data signals DATASR[1:N]. Data signals DATATX[1:N] are provided in serial through an N number of conductors to transmitter circuit 103. Transmitter circuit 103 transmits the data indicated by serial data signals DATATX[1:N] outside the integrated circuit as a set of N serial output data signals DATAOUT in response to clock signal ACLK. Transmitter circuit 103 generates a clock signal BCLK based on clock signal ACLK. Clock signal BCLK is provided to align and deskew circuit 104.

Figure 2:
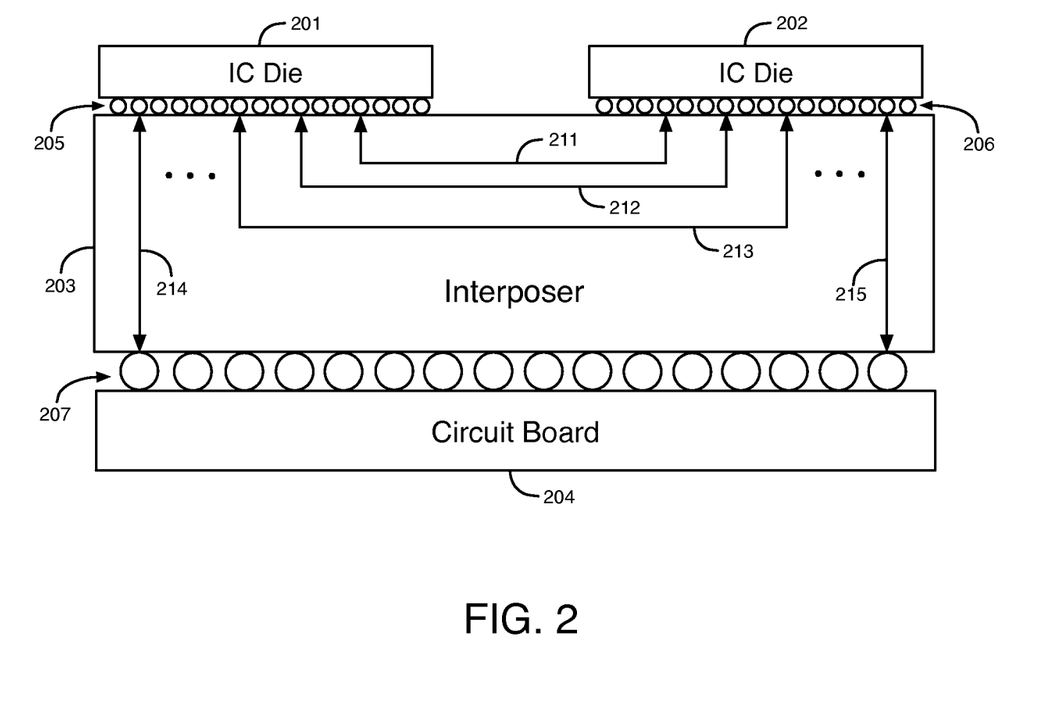
FIG. 2 illustrates an example of two integrated circuits that are connected by an interposer, according to an embodiment of the present invention.

FIG. 2 illustrates an example of two integrated circuits that are connected by an interposer, according to an embodiment of the present invention. FIG. 2 is shown in a cross-sectional view. The system of FIG. 2 includes two integrated circuit (IC) dies 201 and 202, an interposer 203, a circuit board 204, and conductive bumps 205-207. In an embodiment, I/O circuit 101 shown in FIG. 1 is in integrated circuit 201, and circuit 110 shown in FIG. 1 is in integrated circuit 202. In other embodiments, I/O circuit 101 and circuit 110 are both in integrated circuit 201 or are both in integrated circuit 202.

Integrated circuit die 201 is connected to interposer 203 through conductive bumps 205. Integrated circuit die 202 is connected to interposer 203 through conductive bumps 206. Interposer 203 is connected to circuit board 204 through conductive bumps 207.

Data signals are transmitted in serial between integrated circuit 201 and integrated circuit 202 through conductors 211-213 and other conductors in interposer 203. Each of the conductors 211, 212, and 213 transmits a single serial data signal, such as one of the serial data signals DATAIN or one of the serial data signals DATAOUT. Three conductors 211-213 that transmit serial signals between integrated circuits 201 and 202 are shown in FIG. 2 to simplify the drawing. Interposer 203 may have many more conductors that transmit serial signals between integrated circuits 201 and 202.

Signals are transmitted between circuit board 204 and integrated circuit 201 through conductors in interposer 203, such as conductor 214. Signals are transmitted between circuit board 204 and integrated circuit 202 through conductors in interposer 203, such as conductor 215.

Figure 3:
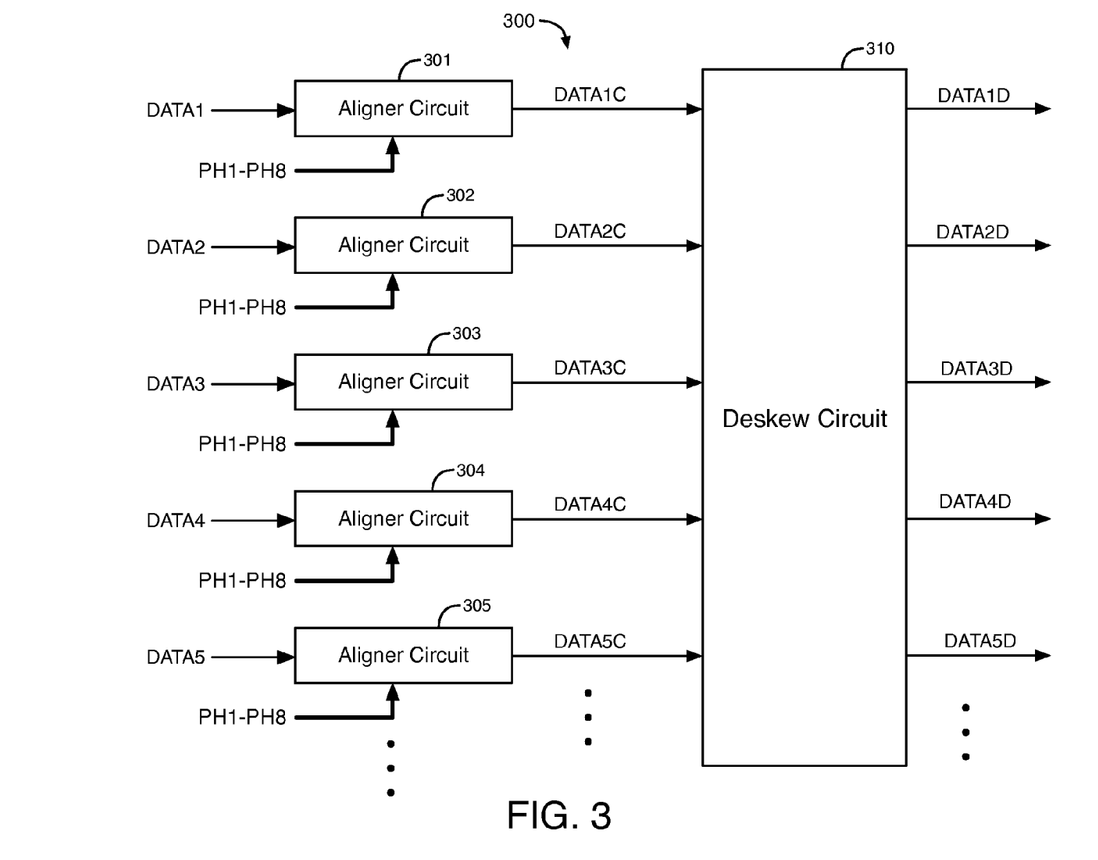
FIG. 3 illustrates an example of an align and deskew circuit, according to an embodiment of the present invention.

FIG. 3 illustrates an example of an align and deskew circuit 300, according to an embodiment of the present invention. Align and deskew circuit 300 includes an N number of aligner circuits and a deskew circuit 310. Five aligner circuits 301-305 are shown in FIG. 3 as an example. Circuit 300 may include any number of aligner circuits. Align and deskew circuit 300 is an example of circuitry in align and deskew circuit 112. Align and deskew circuit 300 is also an example of circuitry in align and deskew circuit 104. In an embodiment of FIG. 1, each of the align and deskew circuits 104 and 112 includes an align and deskew circuit 300 as shown in FIG. 3.

A single serial data signal is provided to an input of each of the aligner circuits in circuit 300. An N number of serial data signals are provided to the N number of aligner circuits in circuit 300. Each of the aligner circuits in circuit 300 receives a different one of the serial data signals. Serial data signals DATA1, DATA2, DATA3, DATA4, and DATA5 are provided to inputs of aligner circuits 301, 302, 303, 304, and 305, respectively, as shown in FIG. 3.

8 control signals PH1, PH2, PH3, PH4, PH5, PH6, PH7, and PH8 are provided to 8 inputs of each of the aligner circuits in circuit 300. Each of the aligner circuits in circuit 300 samples one of the serial data signals and then aligns the data indicated by that serial data signal with an edge of the first control signal PH1 to generate an aligned serial data signal. For example, aligner circuits 301-305 sample serial data signals DATA1, DATA2, DATA3, DATA4, and DATA5 and then align the data indicated by serial data signals DATA1, DATA2, DATA3, DATA4, and DATA5 with control signal PH1 to generate aligned serial data signals DATA1C, DATA2C, DATA3C, DATA4C, and DATA5C, respectively. The aligner circuits in circuit 300 generate an N number of aligned serial data signals.

The aligned serial data signals, including data signals DATA1C, DATA2C, DATA3C, DATA4C, and DATA5C, generated by the aligner circuits are provided to inputs of deskew circuit 310. Deskew circuit 310 reduces skew between the N number of aligned serial data signals to generate an N number of deskewed serial data signals. For example, deskew circuit 310 reduces skew between aligned serial data signals DATA1C, DATA2C, DATA3C, DATA4C, and DATA5C to generate deskewed serial data signals DATA1D, DATA2D, DATA3D, DATA4D, and DATA5D, respectively. Deskewed data signals DATA1D, DATA2D, DATA3D, DATA4D, and DATA5D indicate the same data as data signals DATA1C, DATA2C, DATA3C, DATA4C, and DATA5C, respectively.

For align and deskew circuit 104, the N serial data signals DATA1-DATA5 etc. in FIG. 3 are the data signals DATASR[1:N] shown in FIG. 1, and the N serial data signals DATA1D-DATA5D etc. in FIG. 3 are the data signals DATATX[1:N] shown in FIG. 1. For align and deskew circuit 112, the N data signals DATA1-DATA5 etc. in FIG. 3 are the data signals DATARX[1:N] shown in FIG. 1, and the N serial data signals DATA1D-DATA5D etc. in FIG. 3 are the data signals DATAW shown in FIG. 1.

Figure 4:
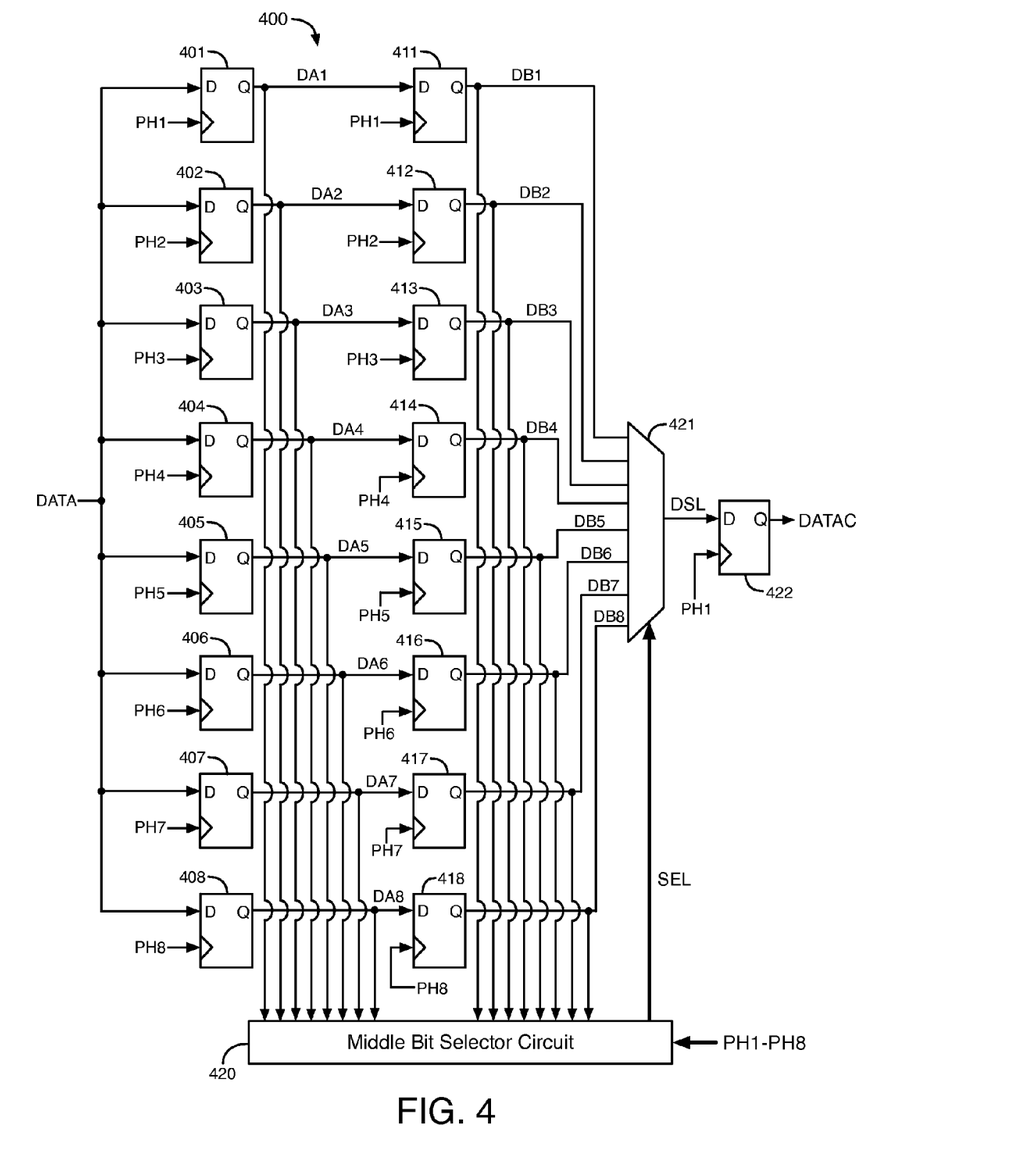
FIG. 4 illustrates an example of an aligner circuit, according to an embodiment of the present invention.

FIG. 4 illustrates an example of an aligner circuit 400, according to an embodiment of the present invention. Aligner circuit 400 includes D flip-flop circuits 401-408, D flip-flop circuits 411-418, middle bit selector circuit 420, multiplexer circuit 421, and D flip-flop circuit 422. Aligner circuit 400 is an example of each of the N number of aligner circuits in align and deskew circuit 300. In an embodiment, each of the aligner circuits 301-305 etc. in align and deskew circuit 300 includes an aligner circuit 400. Flip-flop circuits 401-408, 411-418, and 422 are storage circuits.

A first control signal PH1 is provided to the clock inputs of flip-flop circuits 401 and 411. A second control signal PH2 is provided to the clock inputs of flip-flop circuits 402 and 412. A third control signal PH3 is provided to the clock inputs of flip-flop circuits 403 and 413. A fourth control signal PH4 is provided to the clock inputs of flip-flop circuits 404 and 414. A fifth control signal PH5 is provided to the clock inputs of flip-flop circuits 405 and 415. A sixth control signal PH6 is provided to the clock inputs of flip-flop circuits 406 and 416. A seventh control signal PH7 is provided to the clock inputs of flip-flop circuits 407 and 417. An eighth control signal PH8 is provided to the clock inputs of flip-flop circuits 408 and 418.

According to alternative embodiments, aligner circuit 400 includes a different number of flip-flop circuits. For example, instead of two sets of 8 flip-flop circuits, aligner circuit 400 may have two sets of 5, 6, 7, 9, 10, 11, 12, etc. flip-flop circuits that receive a corresponding number of control signals.

Figure 5:
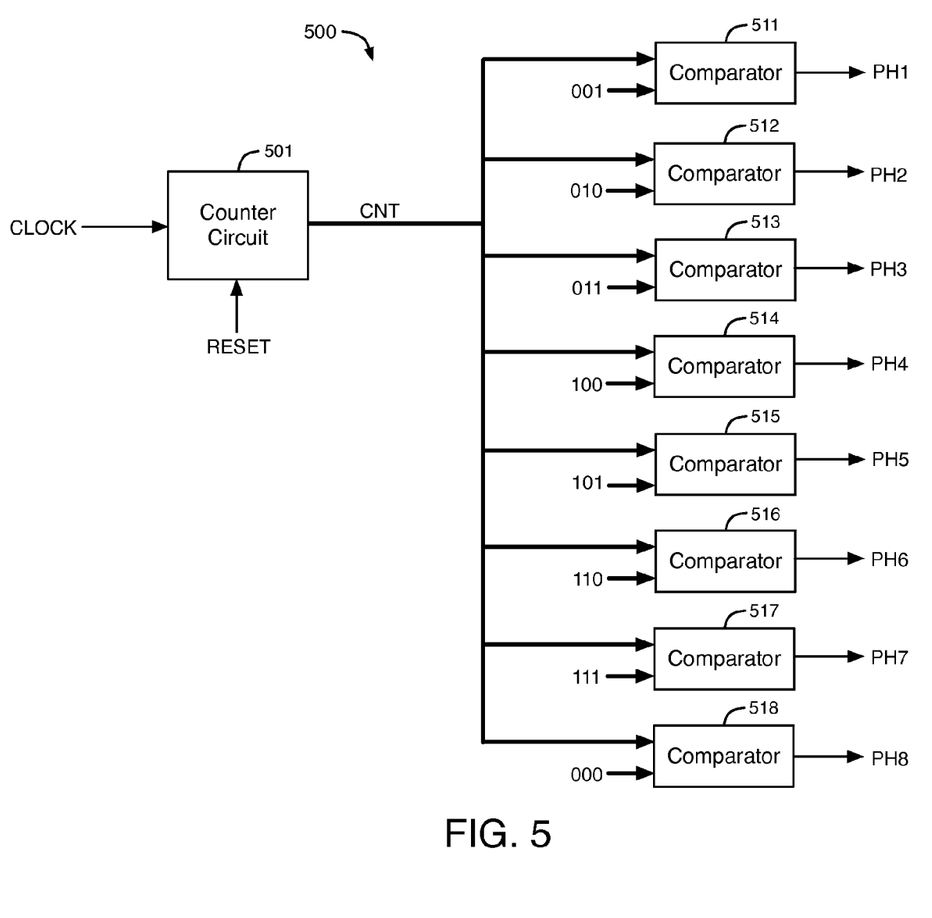
FIG. 5 illustrates an example of a control circuit that generates control signals used in the aligner circuit of FIG. 4, according to an embodiment of the present invention.

FIG. 5 illustrates an example of a control circuit 500 that generates the control signals PH1-PH8, according to an embodiment of the present invention. Control circuit 500 is an example of additional circuitry in align and deskew circuit 112 that generates control signals PH1-PH8. Control circuit 500 is also an example of additional circuitry in align and deskew circuit 104 that generates control signals PH1-PH8. In an embodiment of FIG. 1, each of the align and deskew circuits 104 and 112 includes a control circuit 500 as shown in FIG. 5.

Control circuit 500 includes a counter circuit 501 and eight comparator circuits 511-518. A clock signal CLOCK is provided to a clock input of counter circuit 501, and a reset signal RESET is provided to a reset input of counter circuit 501. Counter circuit 501 generates 3 count signals CNT in parallel at 3 outputs in response to clock signal CLOCK and reset signal RESET. The CLOCK, RESET, CNT, and PH1-PH8 signals are all digital signals that have rising and falling edges. In align and deskew circuit 112, the CLOCK signal may be clock signal RCLK shown in FIG. 1 or derived from clock signal RCLK. In align and deskew circuit 104, the CLOCK signal may be clock signal BCLK shown in FIG. 1 or derived from clock signal BCLK.

The three count signals CNT are provided to three inputs of each of the comparator circuits 511-518. A set of 3 digital reference signals having constant binary values are provided to three additional inputs of each of the comparator circuits 511-518. Digital reference signals having constant binary values of 001, 010, 011, 100, 101, 110, 111, and 000 are provided to inputs of comparator circuits 511-518, respectively, as shown in FIG. 5. As described herein, 0 refers to a logic low state of a digital signal, and 1 refers to a logic high state of a digital signal.

Counter circuit 501 is a 3-bit asynchronous binary counter circuit. While the RESET signal is in a logic high state, counter circuit 501 maintains the digital value of each of the three count signals CNT at zero, causing the count signals CNT to have a binary value of 000. When the RESET signal is in a logic low state, counter circuit 501 is enabled to increase the binary value of the count signals CNT. In response to each rising and falling edge in the CLOCK signal that occurs while the RESET signal is in a logic low state, counter circuit 501 increases the binary value of the count signals CNT by 1.

When the binary value of the count signals CNT increases from 000 to 001, comparator 511 generates a rising edge in control signal PH1, and comparator 518 generates a falling edge in control signal PH8. When the binary value of the count signals CNT increases from 001 to 010, comparator 511 generates a falling edge in control signal PH1, and comparator 512 generates a rising edge in control signal PH2. When the binary value of the count signals CNT increases from 010 to 011, comparator 512 generates a falling edge in control signal PH2, and comparator 513 generates a rising edge in control signal PH3. When the binary value of the count signals CNT increases from 011 to 100, comparator 513 generates a falling edge in control signal PH3, and comparator 514 generates a rising edge in control signal PH4.

When the binary value of the count signals CNT increases from 100 to 101, comparator 514 generates a falling edge in control signal PH4, and comparator 515 generates a rising edge in control signal PH5. When the binary value of the count signals CNT increases from 101 to 110, comparator 515 generates a falling edge in control signal PH5, and comparator 516 generates a rising edge in control signal PH6. When the binary value of the count signals CNT increases from 110 to 111, comparator 516 generates a falling edge in control signal PH6, and comparator 517 generates a rising edge in control signal PH7.

On the next rising or falling edge of the CLOCK signal that occurs after the count signals CNT reach a binary value of 111, counter circuit 501 resets the binary value of the count signals CNT from 111 to 000. When the binary value of the count signals CNT changes from 111 to 000, comparator 517 generates a falling edge in control signal PH7, and comparator 518 generates a rising edge in control signal PH8. The counter circuit 501 then begins to increase the binary value of the count signals CNT by 1 in response to each subsequent rising and falling edge in the CLOCK signal until the count signals CNT reach a binary value of 111. The cycle repeats with comparator circuits 511-518 generating rising edges in control signals PH1-PH8 when the binary value of count signals CNT changes to 001, 010, 011, 100, 101, 110, 111, and 000, respectively. Control signals PH1-PH8 are periodic signals while the RESET signal is in a logic low state.

Referring again to FIG. 4, a DATA signal is provided to the D input of each of the 8 flip-flop circuits 401-408. Each of the 17 flip-flop circuits 401-408, 411-418, and 422 shown in FIG. 4 is a positive edge-triggered flip-flop that stores the logic state of the signal applied to its D input at its Q output only in response to a rising edge in the signal applied to its clock input. Each of the 8 flip-flop circuits 401, 402, 403, 404, 405, 406, 407, and 408 stores the logic state of the DATA signal at its Q output in the respective signal DA1-DA8 in response to each rising edge in the respective control signal PH1-PH8 that is provided to the clock input of that flip-flop circuit. The 8 signals DA1-DA8 stored at the Q outputs of flip-flop circuits 401-408 are provided to inputs of middle bit selector circuit 420.

The 8 signals DA1-DA8 stored at the Q outputs of flip-flop circuits 401-408 are also provided to the D inputs of flip-flop circuits 411-418, respectively. Flip-flop circuits 411, 412, 413, 414, 415, 416, 417, and 418 store the logic states of signals DA1, DA2, DA3, DA4, DA5, DA6, DA7, and DA8 at their Q outputs as signals DB1, DB2, DB3, DB4, DB5, DB6, DB7, and DB8 in response to rising edges in control signals PH1, PH2, PH3, PH4, PH5, PH6, PH7, and PH8, respectively. The 8 signals DB1-DB8 stored at the Q outputs of flip-flop circuits 411-418 are provided to inputs of middle bit selector circuit 420. The 8 signals DB1-DB8 stored at the Q outputs of flip-flop circuits 411-418 are also provided to the 8 multiplexing inputs of multiplexer circuit 421.

Figure 6:
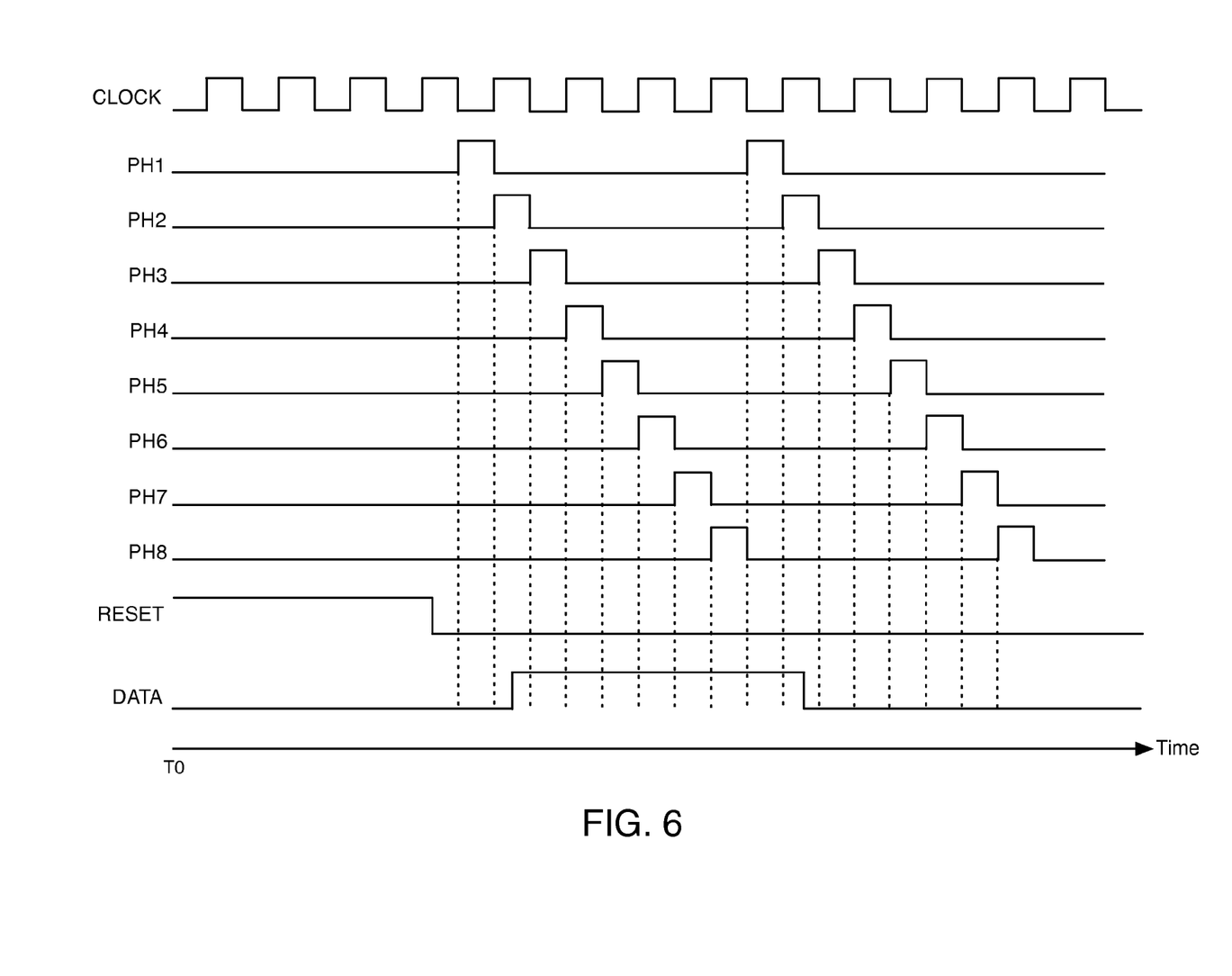
FIG. 6 is a timing diagram that illustrates exemplary waveforms for signals associated with the align and deskew circuit of FIG. 3, according to an embodiment of the present invention.

FIG. 6 is a timing diagram that illustrates exemplary waveforms for signals associated with the align and deskew circuit 300, according to an embodiment of the present invention. FIG. 6 illustrates exemplary waveforms for signals CLOCK, PH1-PH8, RESET, and DATA. The CLOCK signal may, for example, be generated by a phase-locked loop, a delay-locked loop, or a clock data recovery circuit that generates periodic oscillations in the CLOCK signal, as shown in FIG. 6.

Initially, a training pattern is provided in each of the N serial data signals DATA1-DATA5 etc. shown in FIG. 3. The align and deskew circuit 300 uses the training pattern in each of the N serial data signals DATA1-DATA5 etc. to align the data signals based on a common control signal and to reduce any skew between the data signals. In FIG. 4, the DATA signal in aligner circuit 400 corresponds to the serial data signal DATA1-DATA5 etc. provided to the respective aligner circuit 301-305 etc. shown in FIG. 3. The output signal DATAC of aligner circuit 400 corresponds to the serial data signal DATA1C-DATA5C etc. generated by the respective aligner circuit 301-305 etc. shown in FIG. 3.

FIG. 6 illustrates an example of a training pattern for the DATA signal. During the exemplary training pattern of FIG. 6, the DATA signal is initially in a logic low state. After the falling edge in the RESET signal, a logic high state pulse is generated in the DATA signal for the training pattern, as shown in FIG. 6. The logic high state pulse in the DATA signal begins with a rising edge and ends with a falling edge. The logic high state pulse that is generated in the DATA signal for the training pattern lasts for 4 periods of the CLOCK signal.

The RESET signal transitions from a logic high state to a logic low state to start counter circuit 501 varying count signals CNT, as described with respect to FIG. 5. Control circuit 500 begins to generate repeating logic high pulses in each of the control signals PH1-PH8 after the falling edge in the RESET signal, as shown in FIG. 6.

During the exemplary training pattern in the DATA signal shown in FIG. 6, flip-flop circuits 401-408 store the logic states 0, 0, 1, 1, 1, 1, 1, and 1 of the DATA signal in signals DA1-DA8 in response to the first set of rising edges in control signals PH1-PH8, respectively, shown in FIG. 6. In response to the second set of rising edges in control signals PH1-PH8 shown in FIG. 6, flip-flop circuits 411-418 store the logic states 0, 0, 1, 1, 1, 1, 1, and 1 of signals DA1-DA8 in their output signals DB1-DB8, respectively, and flip-flop circuits 401-408 store the logic states 1, 1, 0, 0, 0, 0, 0, and 0 of the DATA signal in signals DA1-DA8, respectively.

Control signals PH1-PH8 are provided to middle bit selector circuit 420. Middle bit selector circuit 420 determines the two middle 1 bits among the eight signals having logic high states (i.e., eight 1 bits) that are stored by flip-flop circuits 401-408 and 411-418 after the second set of rising edges in control signals PH1-PH8 generated during the training pattern. The two middle 1 bits correspond to two signals that are sampled near the middle of the logic high state pulse in the DATA signal during the training pattern. As an example, middle bit selector circuit 420 may be a state machine.

Middle bit selector circuit 420 then generates three digital select signals SEL that indicate one of the signals DB1-DB8 having one of the two middle 1 bits. The select signals SEL are provided to select inputs of multiplexer circuit 421. Multiplexer circuit 421 selects the signal among signals DB1-DB8 that is indicated by the select signals SEL. Multiplexer circuit 421 provides the signal indicated by the select signals SEL (i.e., one of signals DB1-DB8) to the D input of flop-flop circuit 422 as signal DSL. Flip-flop circuit 422 stores the logic state of signal DSL at its Q output as signal DATAC in response to each rising edge in control signal PH1.

In the exemplary training pattern of the DATA signal shown in FIG. 6 and described above, signals DA1-DA2 and DB3-DB8 have logic high states (i.e., 1) and signals DA3-DA8 and DB1-DB2 have logic low states (i.e., 0) after the second set of rising edges in control signals PH1-PH8 shown in FIG. 6. Middle bit selector circuit 420 determines that signals DB6 and DB7 store the middle 1 bits among the eight signals DA1-DA2 and DB3-DB8 having logic high states after the second set of rising edges in control signals PH1-PH8. Middle bit selector circuit 420 then generates logic states for the select signals SEL that cause multiplexer circuit 421 to provide signal DB6 (or DB7) to the D input of flip-flop circuit 422 as signal DSL. The logic state of signal DSL is stored at the Q output of flip-flop circuit 422 as signal DATAC in response to each rising edge in control signal PH1. Thus, aligner circuit 400 aligns a signal that is sampled near the middle of the logic high state pulse in the DATA signal during the training pattern with the phase of the control signal PH1 to generate output data signal DATAC.

Figure 7:
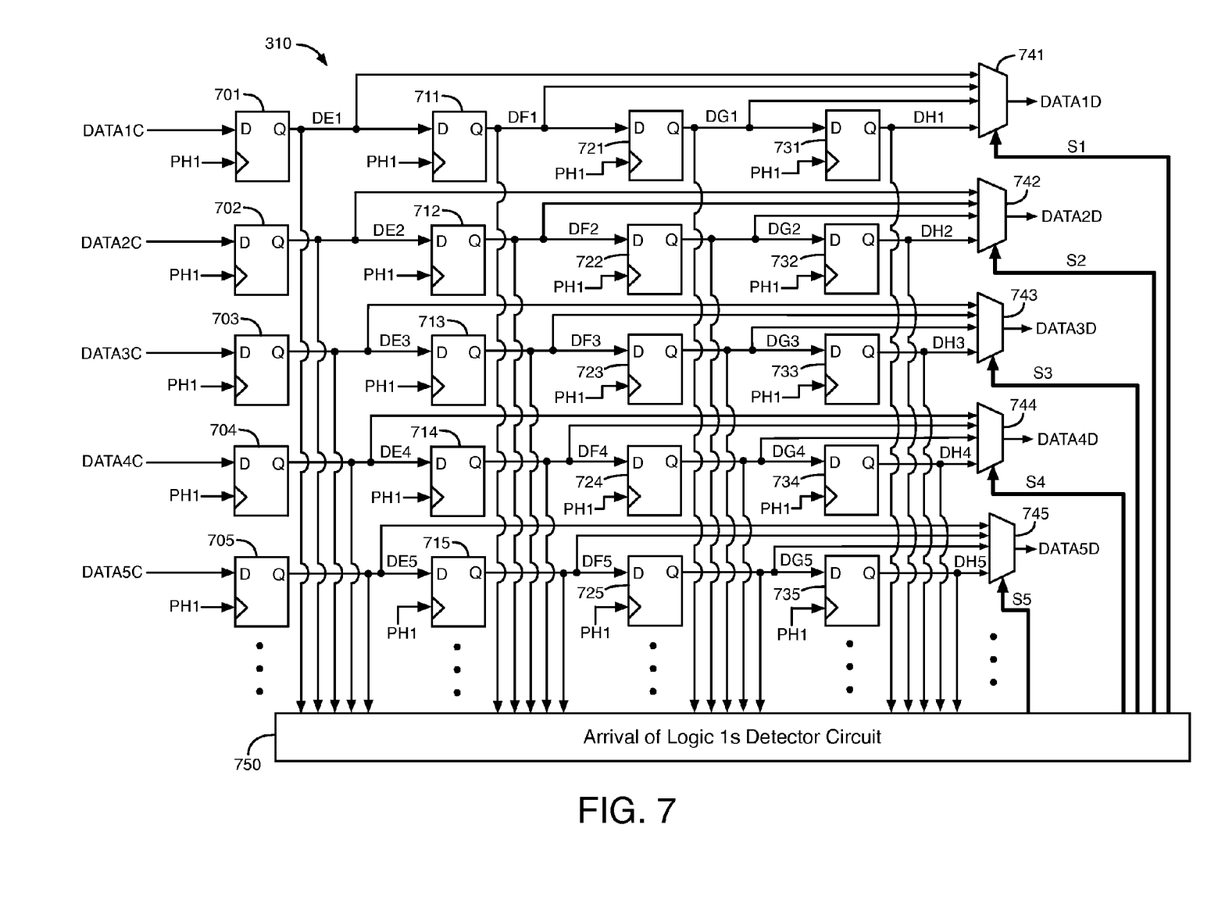
FIG. 7 illustrates an example of a deskew circuit, according to an embodiment of the present invention.

FIG. 7 illustrates an example of deskew circuit 310 shown in FIG. 3, according to an embodiment of the present invention. The N number of aligned serial data signals generated by the aligner circuits 301-305 etc., including data signals DATA1C-DATA5C, are provided to inputs of deskew circuit 310, as shown in FIG. 7. Deskew circuit 310 reduces or removes skew between the N number of aligned serial data signals to generate an N number of deskewed serial data signals. For example, deskew circuit 310 reduces or removes skew between aligned serial data signals DATA1C, DATA2C, DATA3C, DATA4C, and DATA5C to generate deskewed serial data signals DATA1D, DATA2D, DATA3D, DATA4D, and DATA5D, respectively.

Deskew circuit 310 in FIG. 7 includes four banks of D flip-flop circuits, an N number of multiplexer circuits, and an arrival of logic 1s detector circuit 750. Each of the four banks of D flip-flop circuits has an N number of D flip-flop circuits. The first, second, third, and fourth banks of D flip-flop circuits include D flip-flop circuits 701-705, 711-715, 721-725, and 731-735, respectively. Each of the N number of D flip-flop circuits in each of the four banks of D flip-flop circuits in circuit 310 is a positive edge-triggered flip-flop that stores the logic state of the signal applied to its D input at its Q output only in response to a rising edge in the signal applied to its clock input. Each of the D flip-flop circuits in each of the four banks of D flip-flop circuits is a storage circuit. The N multiplexer circuits include multiplexer circuits 741-745.

The N number of aligned serial data signals generated by the aligner circuits 301-305 etc. of FIG. 3 are provided to the D inputs of the flip-flop circuits in the first bank. For example, serial data signals DATA1C, DATA2C, DATA3C, DATA4C, and DATA5C are provided to the D inputs of flip-flop circuits 701-705, respectively, in the first bank. The first control signal PH1 is provided to the clock input of each of the flip-flop circuits in the four banks. For example, control signal PH1 is provided to the clock inputs of flip-flop circuits 701-705, 711-715, 721-725, and 731-735 shown in FIG. 7.

In response to each rising edge in control signal PH1, the flip-flop circuits in the first bank store the logic states of the N number of aligned serial data signals generated by the aligner circuits of FIG. 3 at their Q outputs. For example, flip-flop circuits 701-705 in the first bank store the logic states of serial data signals DATA1C, DATA2C, DATA3C, DATA4C, and DATA5C at their Q outputs as stored signals DE1, DE2, DE3, DE4, and DE5, respectively, in response to each rising edge in control signal PH1.

The signals stored at the Q outputs of the flip-flop circuits in the first bank are provided to the D inputs of the flip-flop circuits in the second bank. In response to each rising edge in control signal PH1, the flip-flop circuits in the second bank store at their Q outputs the logic states of the signals stored by the flip-flop circuits in the first bank. For example, flip-flop circuits 711-715 in the second bank store the logic states of signals DE1, DE2, DE3, DE4, and DE5 at their Q outputs as stored signals DF1, DF2, DF3, DF4, and DF5, respectively, in response to each rising edge in control signal PH1.

The signals stored at the Q outputs of the flip-flop circuits in the second bank are provided to the D inputs of the flip-flop circuits in the third bank. In response to each rising edge in control signal PH1, the flip-flop circuits in the third bank store at their Q outputs the logic states of the signals stored by the flip-flop circuits in the second bank. For example, flip-flop circuits 721-725 in the third bank store the logic states of signals DF1, DF2, DF3, DF4, and DF5 at their Q outputs as stored signals DG1, DG2, DG3, DG4, and DG5, respectively, in response to each rising edge in control signal PH1.

The signals stored at the Q outputs of the flip-flop circuits in the third bank are provided to the D inputs of the flip-flop circuits in the fourth bank. In response to each rising edge in control signal PH1, the flip-flop circuits in the fourth bank store at their Q outputs the logic states of the signals stored by the flip-flop circuits in the third bank. For example, flip-flop circuits 731-735 in the fourth bank store the logic states of signals DG1, DG2, DG3, DG4, and DG5 at their Q outputs as stored signals DH1, DH2, DH3, DH4, and DH5, respectively, in response to each rising edge in control signal PH1.

Deskew circuit 310 has an N number of serial shift registers. Flip-flop circuits 701, 711, 721, and 731 are coupled as a first serial shift register. Flip-flop circuits 702, 712, 722, and 732 are coupled as a second serial shift register. Flip-flop circuits 703, 713, 723, and 733 are coupled as a third serial shift register. Flip-flop circuits 704, 714, 724, and 734 are coupled as a fourth serial shift register. Flip-flop circuits 705, 715, 725, and 735 are coupled as a fifth serial shift register.

The signals stored by each of the N number of serial shift registers in deskew circuit 310 are provided to the multiplexing inputs of one of the multiplexer circuits. The signals DE1, DF1, DG1, and DH1 stored by the first serial shift register are provided to the multiplexing inputs of multiplexer circuit 741. The signals DE2, DF2, DG2, and DH2 stored by the second serial shift register are provided to the multiplexing inputs of multiplexer circuit 742. The signals DE3, DF3, DG3, and DH3 stored by the third serial shift register are provided to the multiplexing inputs of multiplexer circuit 743. The signals DE4, DF4, DG4, and DH4 stored by the fourth serial shift register are provided to the multiplexing inputs of multiplexer circuit 744. The signals DE5, DF5, DG5, and DH5 stored by the fifth serial shift register are provided to the multiplexing inputs of multiplexer circuit 745.

Skew between signals refers to the difference in arrival time between signals that are transmitted at the same time. The serial data signals DATARX[1:N] shown in FIG. 1 may develop skew when transmitted through conductors 121 to align and deskew circuit 112. The serial data signals DATASR[1:N] shown in FIG. 1 may develop skew when transmitted through conductors 123 to align and deskew circuit 104.

The N number of aligned serial data signals generated by the aligner circuits of FIG. 3 and provided to deskew circuit 310 may have skew that is greater than zero. One or more of the N number of aligned serial data signals generated by the aligner circuits of FIG. 3 and provided to deskew circuit 310 may be delayed relative to the other aligned serial data signals generated by the aligner circuits of FIG. 3. For example, if one of signals DATA1C-DATA5C is delayed relative to the other signals DATA1C-DATA5C, then the middle 1 bit selected by the aligner circuit 400 for the delayed signal may be stored in an earlier bank of flip-flops in circuit 310 relative to the middle 1 bits selected by the aligner circuits 400 for the other signals DATA1C-DATA5C.

Each of the signals stored by each of the flip-flop circuits in each of the four banks in circuit 310 is provided to the arrival of logic 1s detector circuit 750. For example, signals DE1-DE5, DF1-DF5, DG1-DG5, and DH1-DH5 are provided to inputs of arrival of logic 1s detector circuit 750. Arrival of logic 1s detector circuit 750 determines the logic state of each of the signals stored by each of the flip-flop circuits in each of the four banks in deskew circuit 310. Arrival of logic 1s detector circuit 750 determines when all of the N number of serial shift registers in deskew circuit 310 have stored a signal having a logic high state (i.e., a 1 bit).

Arrival of logic 1s detector circuit 750 then generates N sets of selects signals, including select signals S1-S5, based on which of the signals stored by the flip-flop circuits are in logic high states in response to the training patterns in the N serial data signals DATA1-DATA5 etc. The select signals are provided to select inputs of the multiplexer circuits. For example, select signals S1, S2, S3, S4, and S5 are provided to the select inputs of multiplexer circuits 741-745, respectively. Arrival of logic 1s detector circuit 750 generates logic states for the select signals that cause each of the multiplexer circuits in deskew circuit 310 to select the signal stored by the corresponding shift register having a logic high state as the deskewed output serial data signal. As a result, deskew circuit 310 reduces or removes any skew between the serial data signals DATA1C, DATA2C, DATA3C, DATA4C, DATA5C etc. to generate deskewed serial data signals DATA1D, DATA2D, DATA3D, DATA4D, DATA5D etc., respectively.

As a specific example, if the DATA5C signal is delayed by one period of control signal PH1 relative to the DATA1C-

DATA4C signals, flip-flop circuit 705 stores a logic high state in signal DE5 indicating the selected middle 1 bit of signal DATA5C, while flip-flop circuits 711-714 store logic high states in signals DF1-DF4 indicating the selected middle 1 bits of signals DATA1C-DATA4C, respectively. The selected middle 1 bits of signals DATA1C-DATA5C were generated in response to the training patterns in the serial data signals DATA1-DATA5, respectively, as described above. In this example, arrival of logic is detector circuit 750 generates logic states for the select signals S1-S4 that cause multiplexer circuits 741-744 to provide signals DF1-DF4 to their outputs as serial data signals DATA1D-DATA4D, respectively. Also, in this example, arrival of logic is detector circuit 750 generates logic states for the select signals S5 that cause multiplexer circuit 745 to provide signal DE5 to its output as serial data signal DATA5D.

As another specific example, if the DATA1C signal is delayed by 3 period of control signal PH1 relative to the DATA2C-DATA5C signals, flip-flop circuit 701 stores a logic high state in signal DE1 indicating the selected middle 1 bit of signal DATA1C, while flip-flop circuits 732-735 store logic high states in signals DH2-DH5 indicating the selected middle 1 bits of signals DATA2C-DATA5C, respectively. In this example, arrival of logic is detector circuit 750 generates logic states for the select signals S2-S5 that cause multiplexer circuits 742-745 to provide signals DH2-DH5 to their outputs as serial data signals DATA2D-DATA5D, respectively. Also, in this example, arrival of logic 1s detector circuit 750 generates logic states for the select signals S1 that cause multiplexer circuit 741 to provide signal DE1 to its output as serial data signal DATA1D.

Thus, deskew circuit 310 reduces or removes the skew between the N number of aligned serial data signals (i.e., DATA1C-DATA5C etc.) to generate deskewed serial output data signals (i.e., DATA1D-DATA5D etc.) that are closer to being aligned with each other in time. Deskew circuit 310 reduces or removes the skew from the serial data signals during the transmission of the training patterns in the serial data signals.

After the training patterns are complete, and deskew circuit 310 has reduced or removed any skew from the serial data signals, data is transmitted through conductors 121 and 123 in the serial data signals DATARX[1:N] and DATASR[1:N], respectively. After deskew circuit 310 has generated logic states for the select signals S1-S5 etc. that reduce or remove skew from the serial data signals, deskew circuit 310 maintains the logic states of the select signals S1-S5 etc. constant during the transmission of data in the serial data signals DATARX[1:N] and DATASR[1:N]. Thus, deskew circuit 310 continues to reduce or remove the same amount of skew between the serial data signals during the transmission of data. Also, each of the aligner circuits 400 maintains the logic states of its select signals SEL constant during the transmission of data in the serial data signals DATARX[1:N] and DATASR[1:N]. Thus, the aligner circuits 301-305 etc. continue to align the serial data signals to the control signal PH1 during the transmission of data in the serial data signals DATARX[1:N] and DATASR[1:N].

According to alternative embodiments, deskew circuit 310 may have a different number of flip-flop banks. For example, deskew circuit 310 may have 2, 3, 5, 6, 7, 8, etc. banks of flip-flops instead of the 4 banks of flip-flops shown in FIG. 7.

Figure 8:
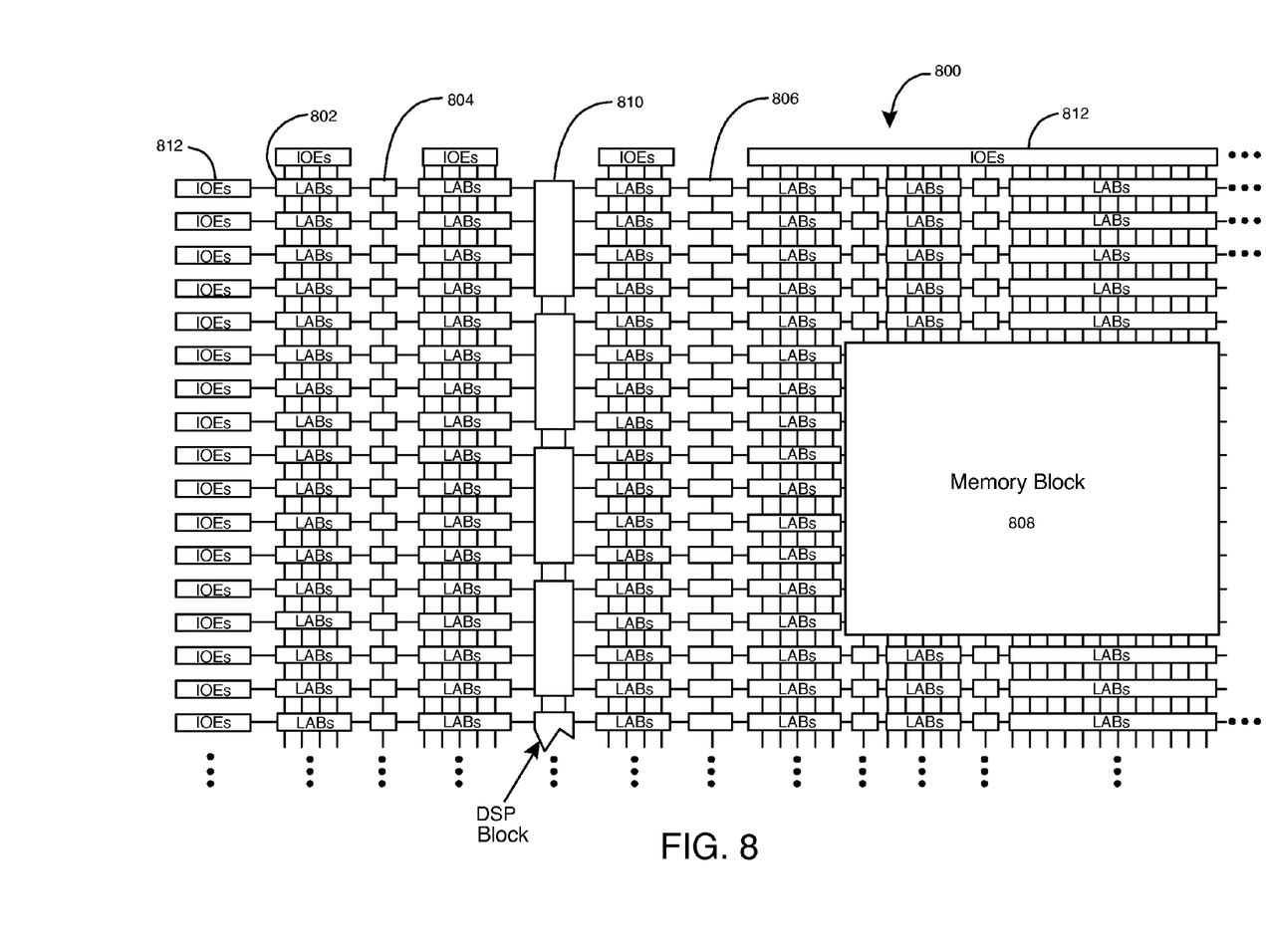
FIG. 8 is a simplified partial block diagram of a field programmable gate array (FPGA) that can include embodiments of the present invention.

FIG. 8 is a simplified partial block diagram of a field programmable gate array (FPGA) 800 that can include embodiments of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 support numerous single-ended and differential input/output standards. IOEs 812 include input and output buffers that are coupled to pins of the integrated circuit. The pins are external terminals of the FPGA die that can be used to route, for example, input data signals, output data signals, and supply voltages between the FPGA and one or more external devices. One or more of the IOEs 812 may include an I/O circuit 101. FPGA 800 is described herein for illustrative purposes. Embodiments of the present invention can be implemented in many different types of integrated circuits.

Figure 9:
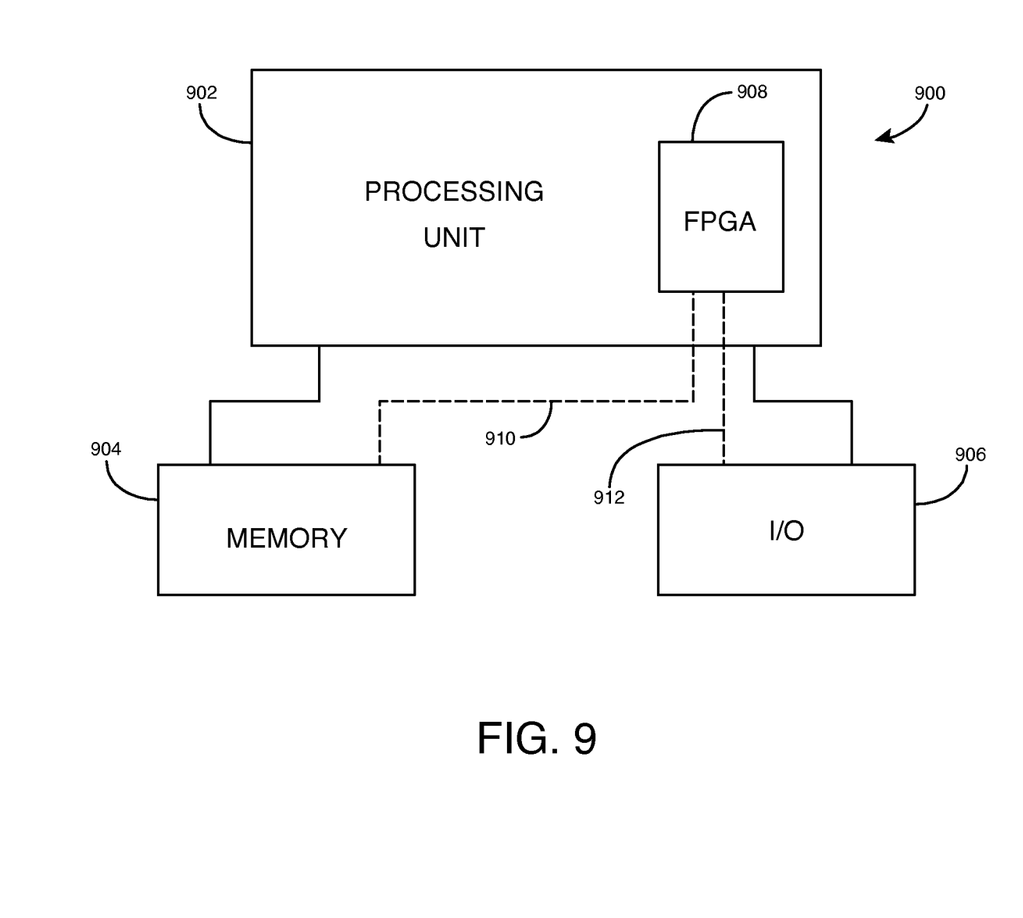
FIG. 9 shows a block diagram of an exemplary digital system that can embody techniques of the present invention.

Embodiments of the present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a first aligner circuit to align data indicated by a first input serial data signal with a phase of a first control signal to generate a first aligned serial data signal;
   a second aligner circuit to align data indicated by a second input serial data signal with the phase of the first control signal to generate a second aligned serial data signal; and
   a deskew circuit to remove skew between the first and the second aligned serial data signals that is at least one period of the first control signal to generate first and second output serial data signals.

2. The circuit of claim 1, wherein the first aligner circuit comprises:
   first storage circuits to store values of the first input serial data signal as first stored signals in response to the first control signal and a second control signal;
   second storage circuits to store values of the first stored signals as second stored signals in response to the first and the second control signals;
   a first multiplexer circuit to receive the second stored signals at multiplexing inputs and to select a first selected signal based on the first and the second stored signals; and
   a third storage circuit to store a value of the first selected signal as the first aligned serial data signal in response to the first control signal.

3. The circuit of claim 2, wherein the second aligner circuit comprises:
   fourth storage circuits to store values of the second input serial data signal as third stored signals in response to the first and the second control signals;
   fifth storage circuits to store values of the third stored signals as fourth stored signals in response to the first and the second control signals;
   a second multiplexer circuit to receive the fourth stored signals at multiplexing inputs and to select a second selected signal based on the third and the fourth stored signals; and
   a sixth storage circuit to store a value of the second selected signal as the second aligned serial data signal in response to the first control signal.

4. The circuit of claim 2, wherein the first aligner circuit further comprises:
   a control circuit to cause the first multiplexer circuit to select as the first selected signal one of the second stored signals that indicates a predefined value of the first input serial data signal during a pulse generated in the first input serial data signal as a training pattern.

5. The circuit of claim 2 further comprising:
   a counter circuit to generate count signals in response to a clock signal;
   a first comparator circuit to generate the first control signal based on the count signals and first reference signals; and
   a second comparator circuit to generate the second control signal based on the count signals and second reference signals, wherein the first and the second control signals are periodic signals.

6. The circuit of claim 1, wherein the deskew circuit comprises a first shift register to store values of the first aligned serial data signal and a second shift register to store values of the second aligned serial data signal.

7. The circuit of claim 6, wherein the deskew circuit further comprises:
   a detector circuit to generate first and second select signals based on first stored signals stored in the first shift register and based on second stored signals stored in the second shift register;
   a first multiplexer circuit to provide one of the first stored signals stored in the first shift register as the first output serial data signal based on the first select signal; and
   a second multiplexer circuit to provide one of the second stored signals stored in the second shift register as the second output serial data signal based on the second select signal.

8. The circuit of claim 1, wherein the circuit is in a first integrated circuit die that is coupled to an interposer, and wherein the first and the second input serial data signals are transmitted from a second integrated circuit die in serial through conductors in the interposer to the first integrated circuit die.

9. A method comprising:
   aligning data indicated by a first input serial data signal with a phase of a first control signal to generate a first aligned serial data signal using a first aligner circuit;
   aligning data indicated by a second input serial data signal with the phase of the first control signal to generate a second aligned serial data signal using a second aligner circuit; and
   removing skew between the first and the second aligned serial data signals that is at least one period of the first control signal to generate first and second output serial data signals using a deskew circuit.

10. The method of claim 9, wherein aligning data indicated by a first input serial data signal with a phase of a first control signal to generate a first aligned serial data signal using a first aligner circuit further comprises:
   storing values of the first input serial data signal in first storage circuits as first stored signals in response to the first control signal and a second control signal;
   storing values of the first stored signals in second storage circuits as second stored signals in response to the first and the second control signals;

selecting one of the second stored signals as a first selected signal based on the first and the second stored signals; and storing a value of the first selected signal in a third storage circuit as the first aligned serial data signal in response to the first control signal.

11. The method of claim 10, wherein aligning data indicated by a second input serial data signal with the phase of the first control signal to generate a second aligned serial data signal using a second aligner circuit further comprises:

storing values of the second input serial data signal in fourth storage circuits as third stored signals in response to the first and the second control signals;

storing values of the third stored signals in fifth storage circuits as fourth stored signals in response to the first and the second control signals;

selecting one of the fourth stored signals as a second selected signal based on the third and the fourth stored signals; and storing a value of the second selected signal in a sixth storage circuit as the second aligned serial data signal in response to the first control signal.

12. The method of claim 11, wherein selecting one of the second stored signals as a first selected signal based on the first and the second stored signals further comprises selecting as the first selected signal the one of the second stored signals that indicates a predefined value of the first input serial data signal generated during a training pattern in the first input serial data signal, and wherein selecting one of the fourth stored signals as a second selected signal based on the third and the fourth stored signals further comprises selecting as the second selected signal the one of the fourth stored signals that indicates a predefined value of the second input serial data signal generated during a training pattern in the second input serial data signal.

13. The method of claim 10 further comprising:
generating count signals in response to a clock signal;
comparing the count signals to first reference signals using a first comparator to generate the first control signal; and
comparing the count signals to second reference signals using a second comparator to generate the second control signal, wherein the first and the second control signals are periodic signals.

14. The method of claim 9, wherein removing skew between the first and the second aligned serial data signals to generate first and second output serial data signals comprises storing values of the first aligned serial data signal in a first shift register, and storing values of the second aligned serial data signal in a second shift register.

15. The method of claim 14, wherein removing skew between the first and the second aligned serial data signals to generate first and second output serial data signals further comprises:

generating first and second select signals based on signals stored in the first and the second shift registers;

providing a signal stored by the first shift register as the first output serial data signal based on the first select signal using a first multiplexer circuit; and providing a signal stored by the second shift register as the second output serial data signal based on the second select signal using a second multiplexer circuit.

16. The method of claim 9, wherein the first and the second input serial data signals are transmitted from a first integrated circuit in serial through conductors in an interposer to a second integrated circuit that performs the method.

17. A system comprising:
a first integrated circuit comprising aligner circuits to align data indicated by each of first and second input serial data signals with an edge of a first control signal to generate first and second aligned serial data signals, and a deskew circuit to remove skew that is at least one period of the first control signal between the first and the second aligned serial data signals to generate first and second output serial data signals; and a second integrated circuit to transmit the first and the second input serial data signals in serial through conductors to the first integrated circuit.

18. The system of claim 17, wherein a first one of the aligner circuits comprises:

first storage circuits to store values of the first input serial data signal as first stored signals in response to the first control signal and a second control signal;

second storage circuits to store values of the first stored signals as second stored signals in response to the first and the second control signals;

a multiplexer circuit to receive the second stored signals at multiplexing inputs and to select a selected signal based on the first and the second stored signals; and a third storage circuit to store a value of the selected signal as the first aligned serial data signal in response to the first control signal.

19. The system of claim 18, wherein the first one of the aligner circuits further comprises:

a control circuit to cause the multiplexer circuit to select as the selected signal one of the second stored signals that indicates a predefined value of the first input serial data signal during a pulse generated in the first input serial data signal as a training pattern.

20. The system of claim 17, wherein the deskew circuit comprises:

a first shift register comprising a first storage circuit to store values of the first aligned serial data signal as a first stored signal and a second storage circuit to store values of the first stored signal as a second stored signal; and a second shift register comprising a third storage circuit to store values of the second aligned serial data signal as a third stored signal and a fourth storage circuit to store values of the third stored signal as a fourth stored signal.

21. The system of claim 20, wherein the deskew circuit further comprises:

a detector circuit to generate first and second select signals based on signals stored in the first shift register and signals stored in the second shift register;

a first multiplexer circuit to provide one of the signals stored in the first shift register as the first output serial data signal based on the first select signal; and a second multiplexer circuit to provide one of the signals stored in the second shift register as the second output serial data signal based on the second select signal.

* * * * *